(12) United States Patent
Sun

(10) Patent No.: US 8,388,075 B2
(45) Date of Patent: Mar. 5, 2013

(54) CABINET FOR ELECTRONIC EQUIPMENT

(75) Inventor: Zheng-Heng Sun, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 189 days.

(21) Appl. No.: 12/967,063

(22) Filed: Dec. 14, 2010

(65) Prior Publication Data

US 2012/0086319 A1   Apr. 12, 2012

(30) Foreign Application Priority Data

Oct. 8, 2010   (CN) .......................... 2010 1 0299596

(51) Int. Cl.
*A47B 96/16* (2006.01)

(52) U.S. Cl. ...................... 312/310; 312/321.5; 312/311

(58) Field of Classification Search ............... 312/265.1, 312/273, 274, 298, 309, 310, 321, 321.5, 312/322, 330.1, 334.5, 334.8, 334.22, 350, 312/223.2, 311, 324, 325; 211/26; 361/679.02, 361/724–727
See application file for complete search history.

(56) References Cited

U.S. PATENT DOCUMENTS

| | | | | |
|---|---|---|---|---|
| 455,883 A * | 7/1891 | Merritt et al. ..................... 4/476 |
| 2,247,232 A * | 6/1941 | Goldberg ...................... 312/274 |
| 2,417,387 A * | 3/1947 | Totty ........................... 190/13 C |
| 2,953,287 A * | 9/1960 | Werner ......................... 224/496 |
| 3,257,933 A * | 6/1966 | Baylinson ..................... 454/203 |
| 3,425,765 A * | 2/1969 | Levy .............................. 312/274 |
| 5,145,245 A * | 9/1992 | Fierthaler .................. 312/321.5 |
| 6,068,356 A * | 5/2000 | Giuseppe ...................... 312/290 |
| 6,076,906 A * | 6/2000 | Royal ........................... 312/273 |
| 6,474,758 B1 * | 11/2002 | Hedrick et al. ............. 312/223.1 |
| 6,698,603 B2 * | 3/2004 | Lawson et al. ............. 211/94.01 |
| 8,201,900 B2 * | 6/2012 | Backhaus et al. ............ 312/274 |
| 2008/0036347 A1 * | 2/2008 | Liang .......................... 312/334.5 |
| 2008/0174217 A1 * | 7/2008 | Walker .......................... 312/329 |
| 2011/0279956 A1 * | 11/2011 | Sun ........................... 361/679.02 |

* cited by examiner

*Primary Examiner* — James O Hansen
*Assistant Examiner* — Daniel Rohrhoff
(74) *Attorney, Agent, or Firm* — Altis Law Group, Inc.

(57) ABSTRACT

A cabinet includes a housing, two first rails, two pairs of pivoting elements, and two second rails. The housing includes two doors pivotably mounted to opposite sides of a front end of the housing. The first rails are respectively fixed to opposite internal sides of the housing. First ends of a pair of pivoting elements are pivotably connected to an inner side of each of the doors, and second ends of the pair of pivoting elements of each of the doors are pivotably connected a corresponding one of the second rails. When the doors are opened parallel to the first rails, the second rails are operable to move relative to the corresponding doors and aligned with the corresponding first rails to form two extended sliding rails.

7 Claims, 5 Drawing Sheets

CABINET FOR ELECTRONIC EQUIPMENT

BACKGROUND

1. Technical Field

The present disclosure relates to a cabinet for electronic equipment.

2. Description of Related Art

To assemble electronic equipment, such as a server to a cabinet, two slide rails are often provided. Each slide rail includes a first rail and a second rail slidably connected to the first rail. The first rails are respectively fixed to opposite inner sides of the cabinet, and the second rails are respectively fixed to opposite sides of the server. Thereby, the server is slidable inward and outward relative to the cabinet. However, this procedure is laborious and troublesome.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
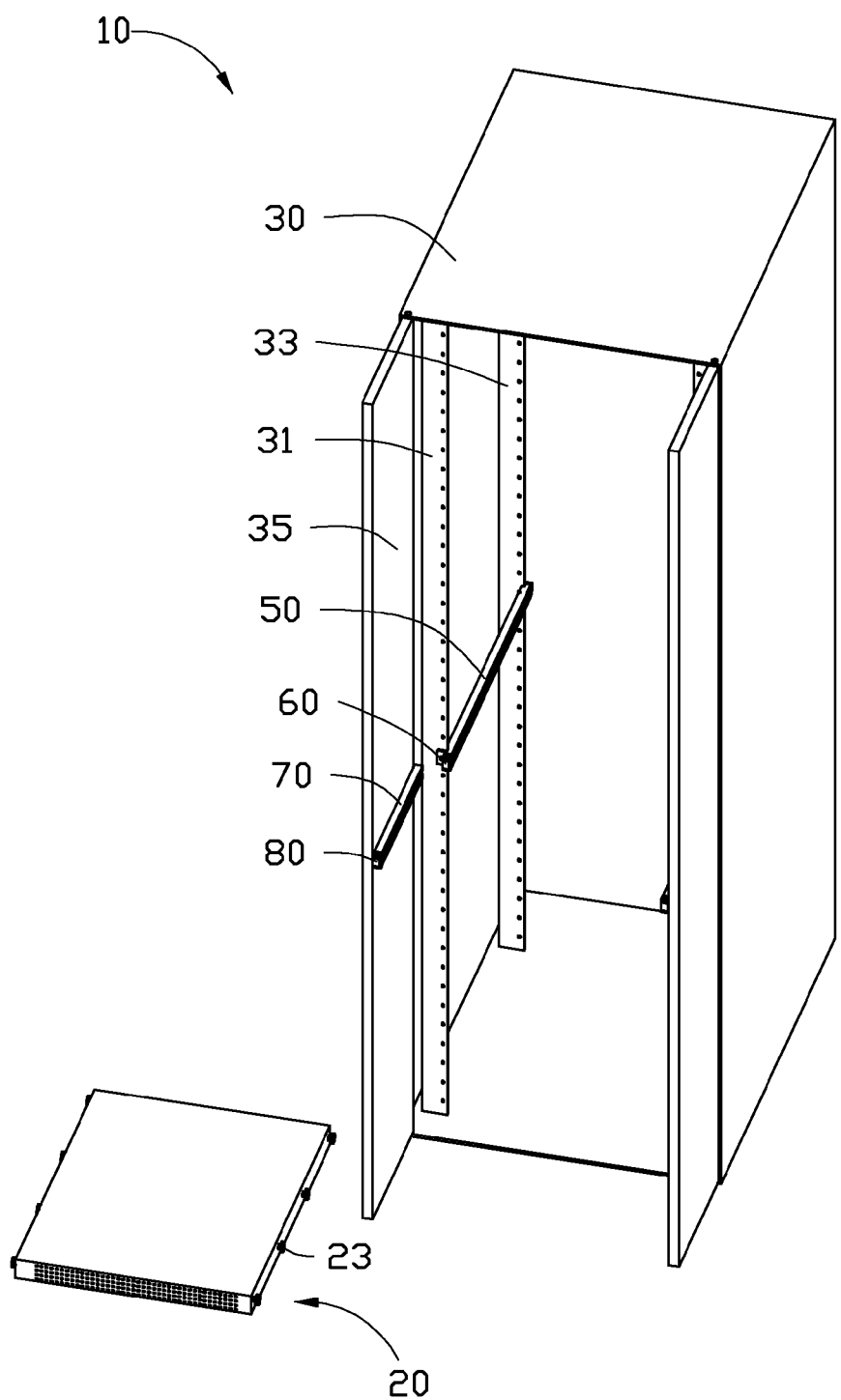
FIG. 1 is an isometric view of an embodiment of a cabinet and a server.
Figure 2:
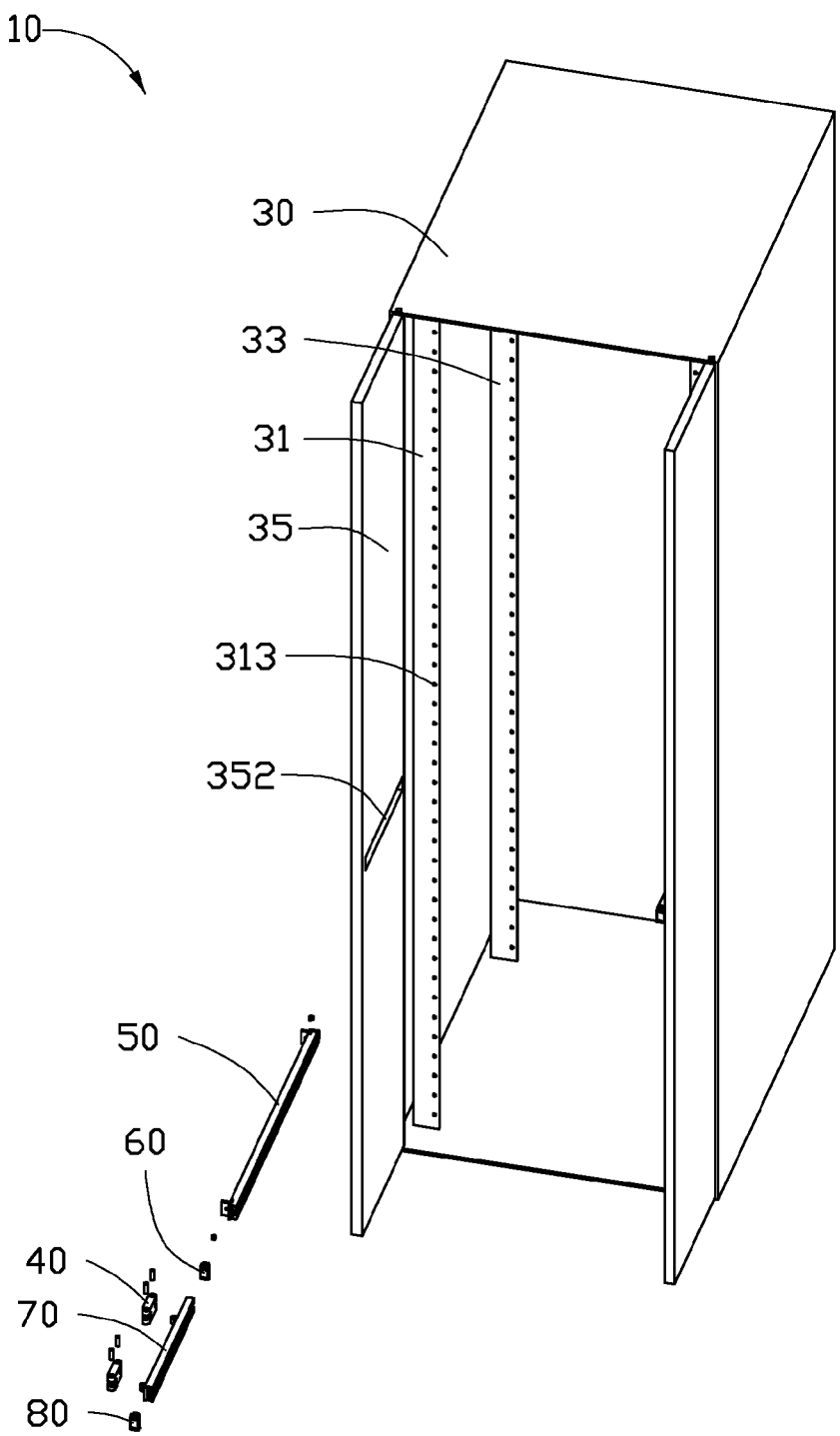
FIG. 2 is an exploded, isometric view of the cabinet of FIG. 1.

Referring to FIGS. 1 and 2, an embodiment of a cabinet 10 is provided to receive a plurality of electronic equipment, such as servers 20. The cabinet 10 includes a housing 30, a plurality of pivoting elements 40, and a plurality of rail assemblies. Each rail assembly includes two first rails 50, two first stop elements 60, two second rails 70, and two second stop elements 80.

A plurality of rollers 23 is installed to two opposite sides of each server 20.

The housing 30 includes two front posts 31 and two rear posts 33. A plurality of fixing holes 313 is defined in each of the front posts 31 and the rear posts 33. Two doors 35 are pivotably mounted to opposite sides of a front end of the housing 30. A plurality of elongated recesses 352 is defined in an inner side of each door 35. Two spaced first pivoting portions (not shown) each defining a through hole is formed on each recess 352.

Figure 4:
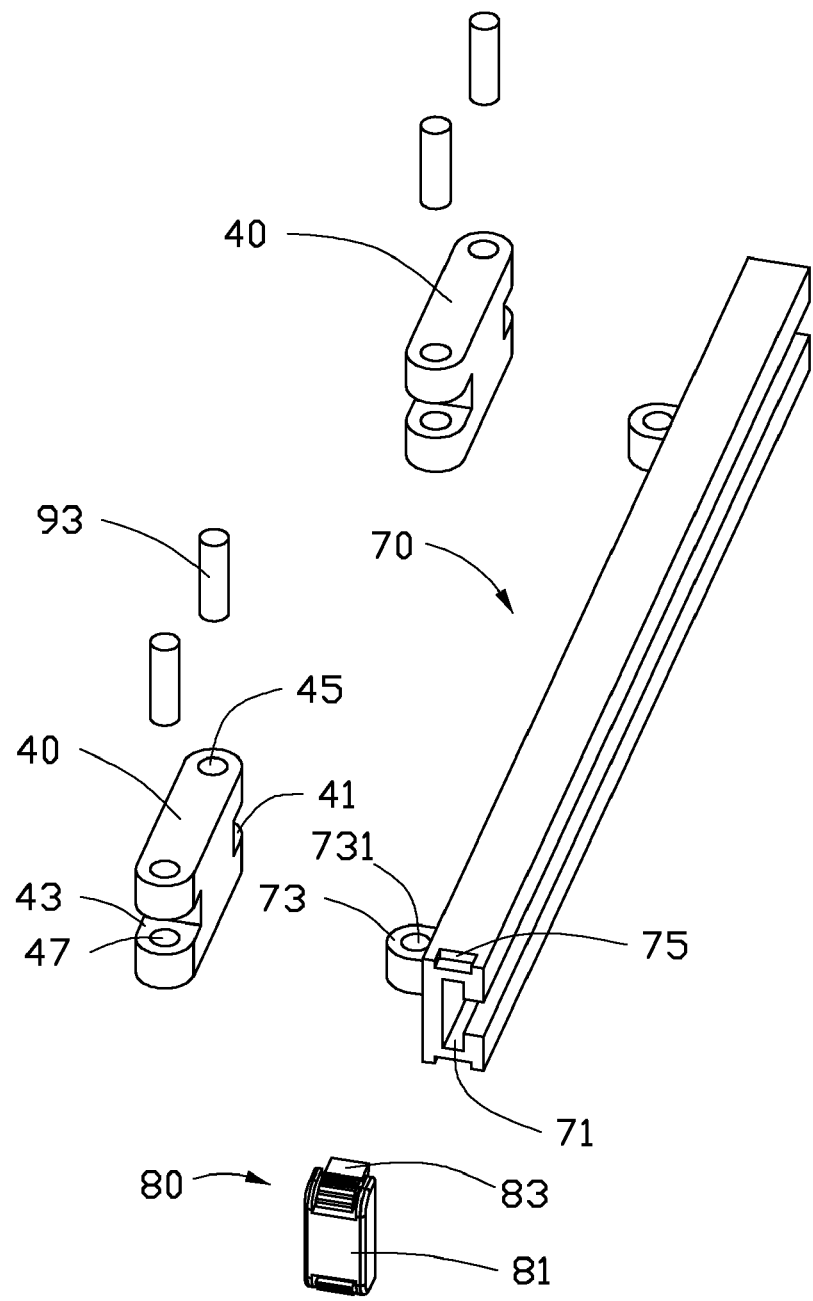
FIG. 4 is an enlarged, isometric view of a second rail, a second stop element, two pivoting elements, and four pins of the cabinet of FIG. 2.

Referring to FIG. 4, a first notch 41 is defined in a middle of a first end of each pivoting element 40. A second notch 43 is defined in a middle of a second end of each pivoting element 40. Two portions bounding opposite sides of the first notch 41 of each pivoting element 40 define a first pivot hole 45 communicating with the first notch 41. Two portions bounding opposite sides of the second notch 43 of each pivoting element 40 define a second pivot hole 47 communicating with the second notch 43.

Figure 3:
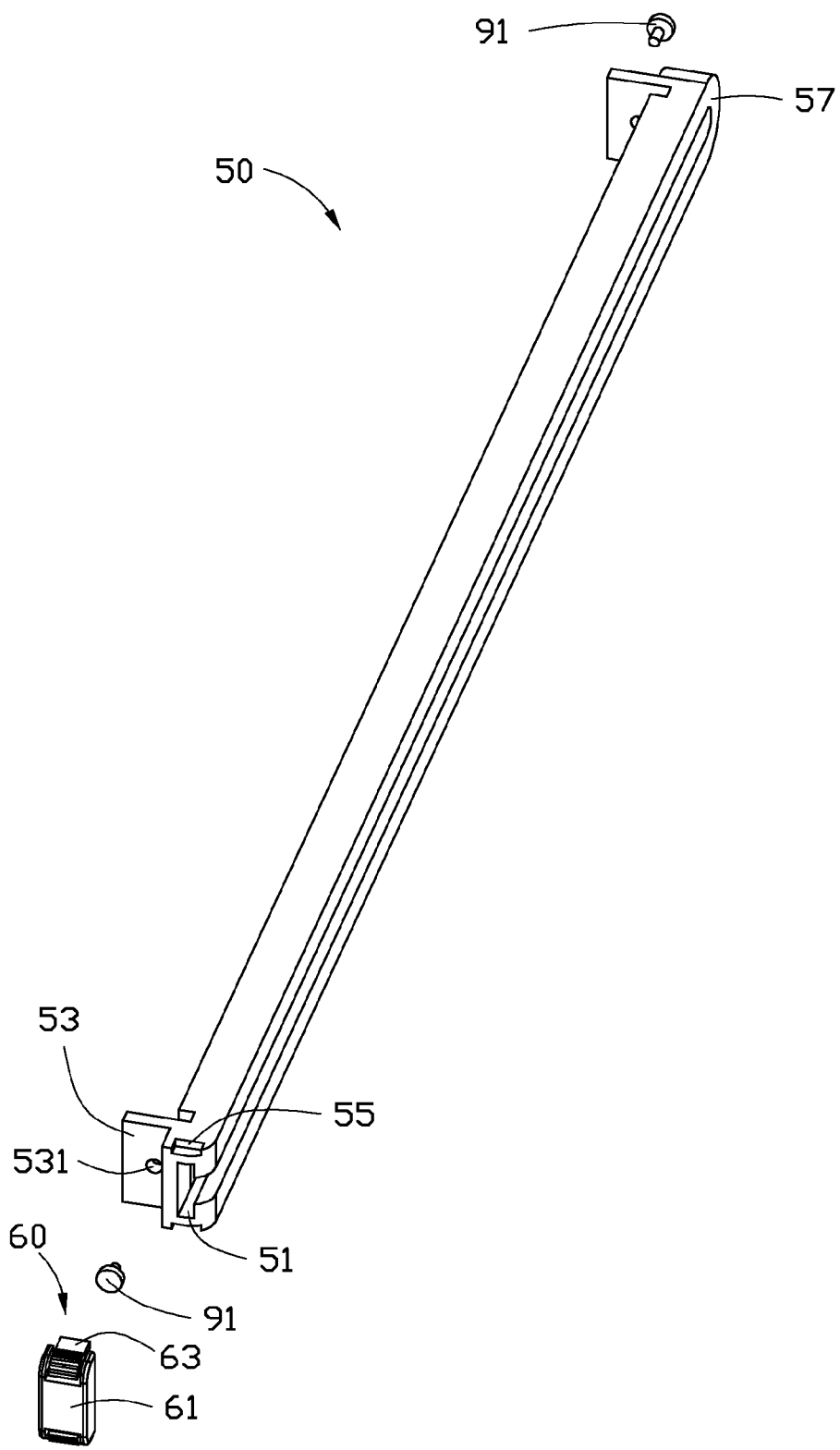
FIG. 3 is an enlarged, isometric view of a first rail, a first stop element, and two screws of the cabinet of FIG. 2.

Referring to FIG. 3, a cross-section of each first rail 50 is substantially C-shaped. A slide slot 51 is defined lengthwise in an inner side of each first rail 50, with a front end of the slide slot 51 extending through a front end of the first rail 50. Two fixing plates 53 respectively extend from opposite ends of an outer side of each first rail 50. A fixing hole 531 is defined in each fixing plate 53. Two latching slots 55 are respectively defined in top and bottom sides of the front end of each first rail 50. A stop plate 57 is formed on a rear end of each first rail 50.

Each first stop element 60 includes a main body 61, and two latches 63 substantially perpendicularly extending from top and bottom ends of the main body 61, respectively.

Referring to FIG. 4, a cross-section of each second rail 70 is substantially C-shaped. A slide slot 71 is defined lengthwise in an inner side of each second rail 70, with opposite ends of the slide slot 71 extending through front and rear ends of the second rail 70. Two second pivoting portions 73 respectively extend from opposite ends of an outer side of each second rail 70. A vertical through hole 731 is defined in each second pivoting portion 73. Two latching slots 75 are respectively defined in top and bottom sides of the front end of each second rail 70.

Each second stop element 80 includes a main body 81, and two latches 83 substantially perpendicularly extending from top and bottom ends of the main body 81, respectively.

Referring to FIGS. 1 to 4, to assemble each rail assembly to the housing 30, the fixing plates 53 of the first rails 50 are positioned to sandwich the front and rear posts 31 and 33. Four screws 91 are respectively extended through the fixing holes 531 of the fixing plates 53 of the first rails 50, and engage in the corresponding fixing holes 313 of the front and rear posts 31 and 33 on a same level, thereby the first rails 50 are respectively fixed to left and right insides of the housing 30. Two pivoting elements 40 are placed in a recess 352 of each door 35 in alignment with a corresponding first rail 50, with the first pivoting portions in the recess 352 inserted into the first notches 41 of the corresponding pivoting elements 40. Four pins 93 are respectively extended through the first pivot holes 45 of the pivoting elements 40 and the through holes of the corresponding first pivoting portions. Thereby, the first ends of the pivoting elements 40 are pivotably installed in the corresponding recesses 352 of the doors 35. The second rails 70 are respectively coupled to the doors 35, with the second pivoting portions 73 inserted in the second notches 43 of the corresponding pivoting elements 40. Four pins 93 are respectively extended through the second pivot holes 47 of the pivoting elements 40 and the through holes 731 of the corresponding second pivoting portions 73. Thereby, the second rails 70 are pivotably connected to the second ends of the corresponding pivoting elements 40 of the doors 35. Each second rail 70 can make a translational motion toward or away from the corresponding door 35 because of the corresponding pivoting elements 40. The first and second stop elements 60 and 80 are respectively installed to the front ends of the first and second rails 50 and 70, with the latches 63 of the first stop elements 60 engaging in the latching slots 55 of the corresponding first rails 50, and the latches 83 of the second top elements 80 engaging in the latching slots 75 of the corresponding second rails 70.

When there is no need to use the slide assembly, the second rails 70 and the second ends of the pivoting elements 40 connected to the corresponding second rails 70 are moved forwards and towards the corresponding doors 35, until the pivoting elements 40 are entirely received in the corresponding recesses 352 and parallel to the second rails 70. The second rails 70 are positioned near the corresponding doors 35, and occupy little space.

Figure 5:
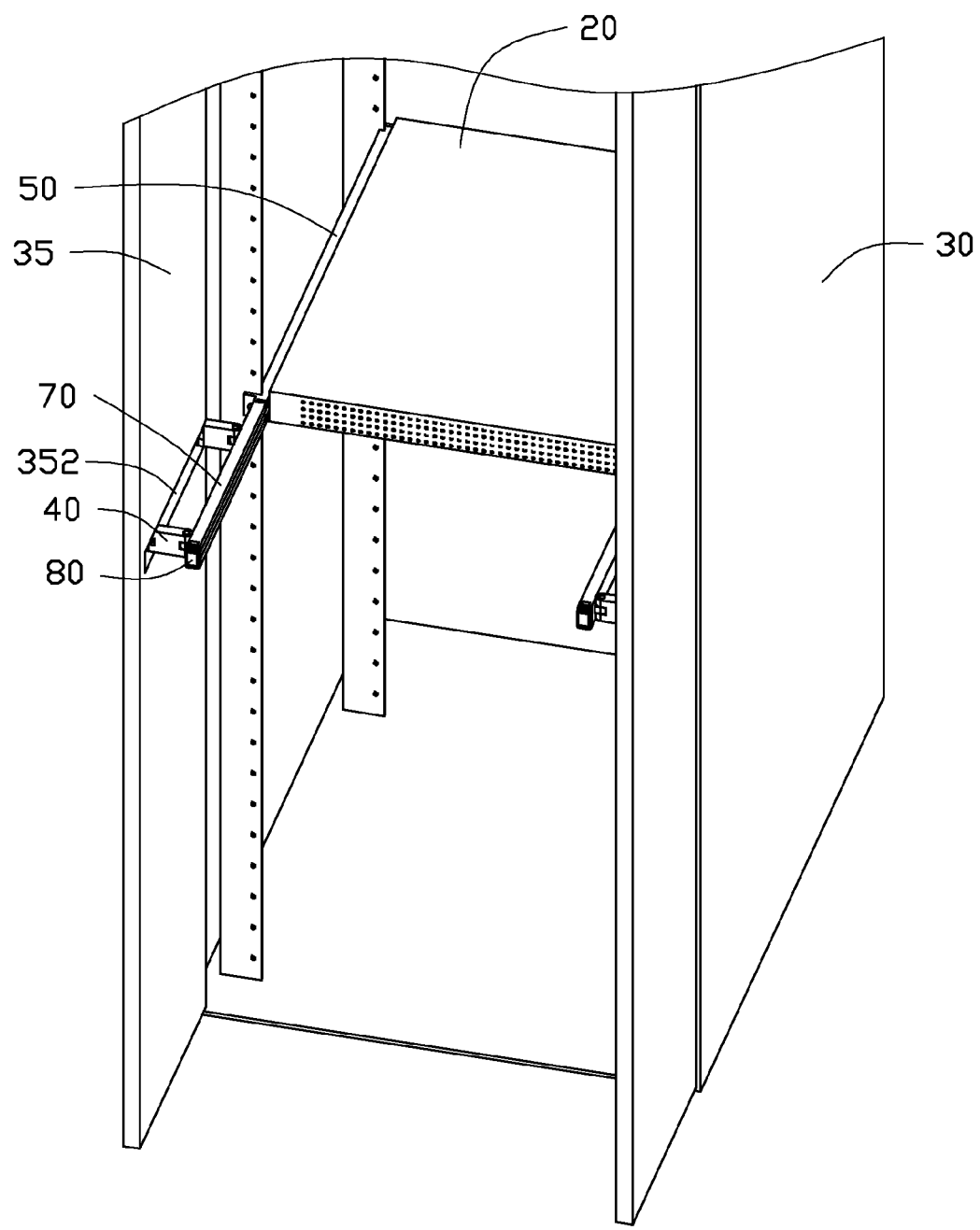
FIG. 5 is an assembled, isometric view of the cabinet and the server of FIG. 1.

Referring to FIG. 5, to assemble a server 20, the doors 35 are opened parallel to the first rails 50. The first and second stop elements 60 and 80 are detached from the corresponding first and second rails 50 and 70. The second rails 70 and the second ends of the pivoting elements 40 connected to the corresponding second rails 70 are moved rearwards and away from the corresponding doors 35, until the second rails 70 align with the corresponding first rails 50 to form two extended sliding rails, and the slide slots 71 align with the corresponding slide slots 51. At this time, the pivoting elements 40 are perpendicular to the corresponding doors 35 and second rails 70, respectively. The rollers 23 at two sides of the server 20 are inserted into the slide slots 71 of the corresponding second rails 70. The server 20 is pushed rearwards to slide along the second rails 70 and first rails 50, until two rollers 23 at a distal end of the server 20 abut against the stop plates 57 of the corresponding first rails 50. The server 20 is entirely received in the housing 30 and arranged between the first rails 50.

To work on the server 20, the server 20 is pulled outwards and arranged between the second rails 70. The second stop elements 80 are respectively installed to the front ends of the second rails 70, to prevent the server 20 from being detached from the front ends of the second rails 70.

To close the doors 35, the second rails 70 are moved forward and toward the corresponding doors 35, to allow the pivoting elements 40 to be entirely received in the corresponding recesses 352, and the second rails 70 position near the corresponding doors 35. The first stop elements 60 are respectively installed to the front ends of the first rails 50, to prevent the server 20 from being detached from the front ends of the first rails 50. The doors 35 are closed.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A cabinet comprising:
   a housing comprising two doors pivotably mounted to opposite sides of a front end of the housing;
   two first rails respectively fixed to opposite internal sides of the housing;
   two pairs of pivoting elements, first ends of one of the two pairs of pivoting elements pivotably connected to an inner side of a corresponding one of the doors; and
   two second rails, second ends of the pair of pivoting elements of the corresponding one of the doors pivotably connected a corresponding one of the second rails;
   when the doors are opened parallel to the first rails, the second rails are operable to move relative to the corresponding doors and align with the corresponding first rails to form two extended sliding rails.

2. The cabinet of claim 1, wherein when the doors are opened, each of the second rails is movable relative to the corresponding door from a first position close to the door to a second position away from the door, when the second rail is in the first position, the corresponding pivoting elements connected to the second rail are parallelly sandwiched between the second rail and the door, the second ends of the pivoting elements are at front of the first ends of the pivoting elements; when the second rail is in the second position, the corresponding pivoting elements connected to the second rail are perpendicular to the second rail and the door such that one of the two extended sliding rails is formed.

3. The cabinet of claim 1, wherein two front posts and two rear posts are formed within the housing, a fixing hole is defined in each of the front and rear posts, the fixing holes are on a level, two fixing plates respectively extend from opposite ends of an outer side of each of the first rails, a fixing hole is defined in each of the fixing plates, four screws extend through the fixing holes of the fixing plates and engage in the fixing holes of the front and rear posts, to fix the first rails to the front and rear posts.

4. The cabinet of claim 1, wherein a cross-section of each of the first and second rails is substantially C-shaped, a slide slot is defined lengthwise in an inner side of each of the first and second rails.

5. The cabinet of claim 4, wherein a stop plate is formed on a rear end of each of the first rails.

6. The cabinet of claim 1, wherein an elongated recess is defined in the inner side of each of the doors, the first ends of the pairs of pivoting elements are pivotably received in the recesses of the corresponding doors, when the second rails move away from the corresponding first rails, the second ends of the pairs of pivoting elements are gradually received in the corresponding recesses and arranged at front of the corresponding first ends.

7. The cabinet of claim 1, further comprising two first stop elements detachably installed to front ends of the first rails respectively, and two second stop elements detachably installed to front ends of the second rails respectively.

* * * * *